United States Patent [19]

Mochizuki et al.

[11] Patent Number: 5,431,863
[45] Date of Patent: Jul. 11, 1995

[54] METHOD OF MOUNTING SEMICONDUCTOR DEVICE

[75] Inventors: Amane Mochizuki; Masako Maeda; Masakazu Sugimoto; Munekazu Tanaka; Tetsuya Terada, all of Osaka, Japan

[73] Assignee: Nitto Denko Corporation, Osaka, Japan

[21] Appl. No.: 101,817

[22] Filed: Aug. 4, 1993

Related U.S. Application Data

[63] Continuation of Ser. No. 826,417, Jan. 27, 1992, abandoned.

Foreign Application Priority Data

Jan. 28, 1991 [JP] Japan ................. 3-027871

[51] Int. Cl.⁶ ............... B29C 65/48; B26F 1/31
[52] U.S. Cl. ...................... 264/25; 264/156; 264/261; 264/263; 264/272.17; 264/273
[58] Field of Search ............... 264/272.17, 273, 279.1, 264/295, 293, 294, 263, 154, 155, 156, 25

[56] References Cited

U.S. PATENT DOCUMENTS 4,017,495 4/1977 Jaffe et al. .................. 264/272.17
4,746,392 5/1988 Hoppe ....................... 264/272.17

*Primary Examiner*—Jan H. Silbauch
*Assistant Examiner*—Angela Ortiz
*Attorney, Agent, or Firm*—Sughrue, Mion, Zinn, Macpeak & Seas

[57] ABSTRACT

A method of mounting a semiconductor device including a film carrier having an insulating film having on one side thereof a connecting lead and a semiconductor element junctioned with the film carrier on an outer substrate, which includes forming an opening for adhesive forcing or adhesive injection in the insulating film within its bonding area to be in contact with a land part on the outer substrate and in an area near the bonding area, connecting the connecting lead to the land part on the outer substrate, and forcing or injecting an adhesive through the opening formed in the insulating film into the space between the film carrier and the outer substrate.

7 Claims, 3 Drawing Sheets

METHOD OF MOUNTING SEMICONDUCTOR DEVICE

This is a Continuation of application Ser. No. 07/826,417, filed Jan. 27, 1992, now abandoned.

FIELD OF THE INVENTION

The present invention relates to a method of mounting a semiconductor device. More particularly, this invention relates to a mounting method for tenaciously connecting a film carrier of a semiconductor device to an outer substrate.

BACKGROUND OF THE INVENTION

In connecting a semiconductor device employing a film carrier to an outer substrate such as a package substrate or a case (outer lead bonding), a linear connecting lead formed on the film carrier of the semiconductor device and made of an electroconductive metal such as copper has been and is being utilized. For example, as shown in FIG. 11, when a semiconductor device in which a connecting lead 4 formed on a film carrier 3 has been connected with a semiconductor element 1 through a bump 2 is mounted on an outer substrate 5, a metallic wiring (land part) 6 formed on the surface of the outer substrate 5 and the connecting lead 4 on the film carrier 3 are utilized.

However, such a mounting method is disadvantageous in that its working efficiency is low because the connecting lead 4 is required to be cut or bent and that connection itself is not easy. In addition, the connecting lead 4 has poor mechanical strength because it projects from the film carrier, so that there are cases where the mounted semiconductor device fails to have a connecting strength sufficient to withstand mechanical or thermal shocks and, as a result, the mounted semiconductor device has poor reliability in electrical connection. In connecting the connecting lead 4 with the land part 6, thermal junctioning techniques such as a solder reflow method are usually employed. According to such techniques, in the case of mounting a semiconductor device on, for example, a metal oxide-based transparent electrode such as a liquid-crystal panel, it is necessary that the surface of the transparent electrode is metallized beforehand so as to enable soldering.

In recent years, various methods have been proposed in which the film carrier of a semiconductor device is junctioned with an outer substrate by means of an anisotropically electroconductive film or coating in order to attain a high connecting strength. Any of these methods, however, is defective in that the mounted semiconductor device, if it is of a multiple pin type with a small gap between pins, has a fear of the occurrence of interpin leak and that the products are expensive.

SUMMARY OF THE INVENTION

As a result of intensive studies made by the present inventors, it has been found that by using, as the film carrier of a semiconductor device, an insulating film having a minute hole extending from one side to the other side thereof, a cut-out opening, or an aperture, and by connecting a connecting lead of the semiconductor device to a land part on an outer substrate and then forcing an adhesive through the through-hole, cut-out opening, or aperture into the space between the film carrier and the outer substrate, it becomes possible to attain highly reliable mounting because the connecting lead, the land part, and other connecting parts can be covered with the adhesive and, as a result, tenacious connection is established, interpin leak can be avoided, electrical conduction becomes stable, and the product has excellent stability to mechanical or thermal shocks. The present invention has been completed based on the above finding in order to overcome the drawbacks of the above-described prior art techniques.

Accordingly, an object of the present invention is to provide a method of semiconductor device mounting which comprises mounting a semiconductor device on an outer substrate (by means of outer lead bonding) by junctioning a connecting lead of the semiconductor device with the outer substrate and which attains covering and protection of the circuit pattern and tenacious bonding of the semiconductor device to the outer substrate thereby to improve the electrical connection reliability and eliminate the interpin leak problem especially for the multiple pin type.

The present invention provides a method of mounting a semiconductor device comprising a film carrier comprising an insulating film having on one side thereof a connecting lead and a semiconductor element junctioned with the film carrier on an outer substrate, which comprises forming an opening for adhesive forcing or adhesive injection in the insulating film within its bonding area to be in contact with a land part on the outer substrate and in an area near the bonding area, connecting the connecting lead to the land part on the outer substrate, and forcing or injecting an adhesive through the opening formed in the insulating film into the space between the film carrier and the outer substrate.

DETAILED DESCRIPTION OF THE INVENTION

Embodiments of the present invention are described below by reference to the drawings.

Figure 1:
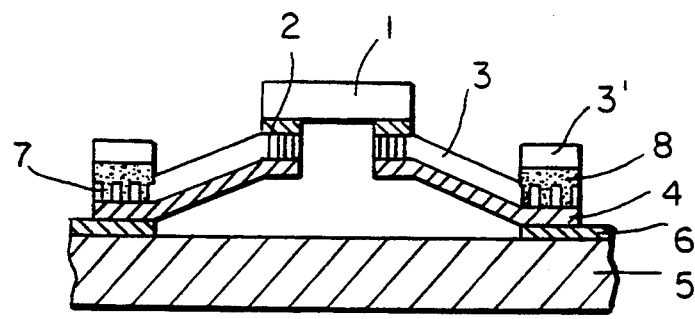
FIG. 1 is a sectional view of a structure obtained by the semiconductor device-mounting method of the present invention.
Figure 11:
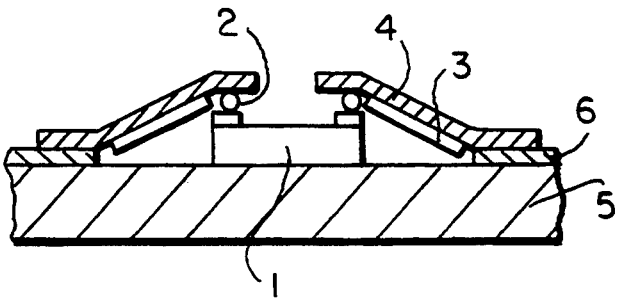
FIG. 11 is a sectional view illustrating a structure obtained by mounting a semiconductor device by a conventional method known in the art.

In FIG. 1, which is a sectional view of a structure obtained by the semiconductor device-mounting method of the present invention, is shown a semiconductor element 1 junctioned with a film carrier comprising an insulating film 3 having a connecting lead 4 on one side thereof. The insulating film 3 has a minute through-hole as an opening 7 for adhesive forcing or adhesive injection, and the connecting lead 4 on the insulating film 3 is connected to a metallic wiring (land part) 6 on an outer substrate 5. This connection is established by an adhesive forced through the minute through-hole into the space between the film carrier and the outer substrate 5 and the adhesive reinforces the connecting parts and covers the areas surrounding the connecting parts. In the semiconductor device shown in FIG. 1, the semiconductor element 1 and the connecting lead 4 are electrically connected with each other by means of a metallic material 2' filling up a minute through-hole formed in the insulating film 3. However, it is a matter of course that the semiconductor element 1 and the connecting lead 4 may be connected by a conventional method, for example, by means of a bump as shown in FIG. 11.

Figure 2A:
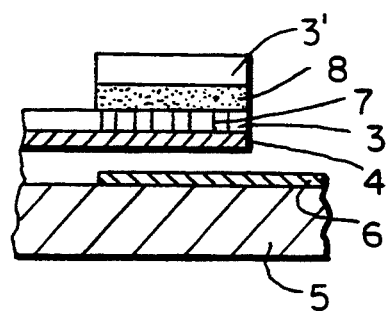
FIGS. 2(a) and (b) and FIGS. 3(a) and (b) are enlarged sectional views illustrating the method of connecting the film carrier with the land part on the outer substrate in producing the structure shown in FIG. 1.
Figure 2B:
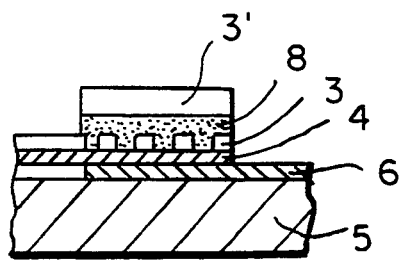
Figure 3A:
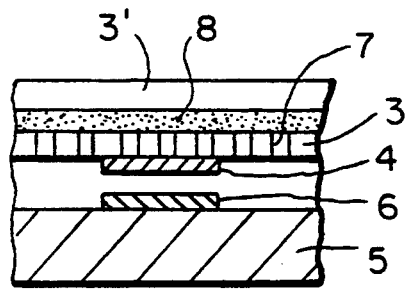
Figure 3B:
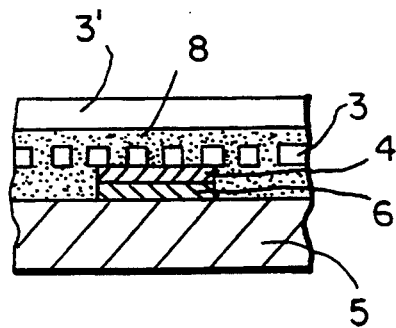

In FIGS. 2(a) and (b) and FIGS. 3(a) and (b) are shown enlarged sectional views illustrating the method of connecting the film carrier with the land part on the outer substrate in producing the structure of FIG. 1. FIG. 2(a) and FIG. 3(a) each is a sectional view illustrating the state of the semiconductor device before the connection is established, in which a sheet-form adhesive layer 8 formed on an insulating film 3' as a support has been laminated to the insulating film 3 on the side opposite to the connecting lead 4 side. FIG. 2(b) and FIG. 3(b) each is a sectional view illustrating the state of the semiconductor device after the connection has been established, in which a part of the adhesive has been injected, by pressing, through the through-hole in contact with the layer 8 into the junction space between the film carrier and the outer substrate and covers the connecting parts and the surrounding areas. The views of FIG. 2 are sectional views taken along a plane parallel to the direction of the connecting lead, while those of FIG. 3 are sectional views taken along a plane perpendicular to the direction of the connecting lead.

Figure 4:
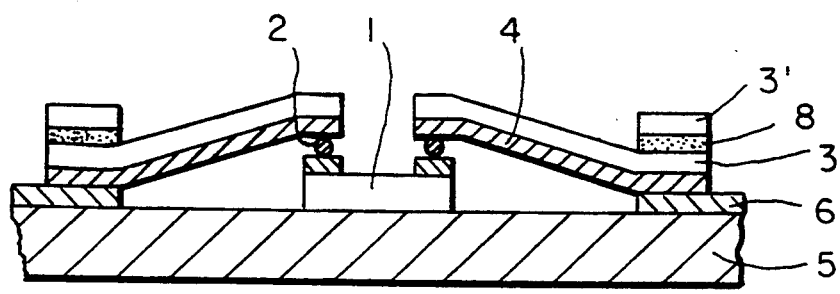
FIG. 4 is a sectional view of another structure obtained by the semiconductor device-mounting method of the present invention.

In FIG. 4, which is a sectional view of another structure obtained by the semiconductor device-mounting method of the present invention, is shown a semiconductor element 1 junctioned through a bump 2 with a film carrier comprising an insulating film 3 having a connecting lead 4 on one side thereof. The insulating film 3 has a cut-out opening or aperture (not shown) as the opening for adhesive forcing or adhesive injection, and the connecting lead 4 on the insulating film 3 is connected to a metallic wiring (land part) 6 on an outer substrate 5. Further, the insulating film 3 used is laminated, on the side opposite to the connecting lead side, with a sheet-form adhesive layer 8 supported by an insulating film 3', and part of the adhesive constituting the adhesive layer is injected, by heat-pressing or the like, through the cut-out opening or aperture into the space between the film carrier and the outer substrate. The injected adhesive reinforces the connecting parts and covers the areas surrounding the connecting parts.

Figure 5A:
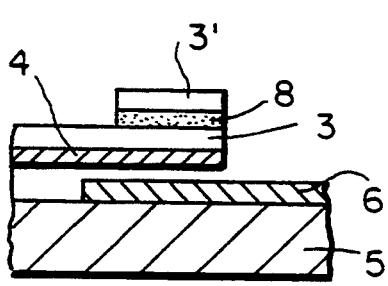
FIGS. 5(a) and (b) and FIGS. 6(a) and (b) are enlarged sectional views illustrating the method of connecting the film carrier with the land part on the outer substrate in producing the structure shown in FIG. 4.
Figure 5B:
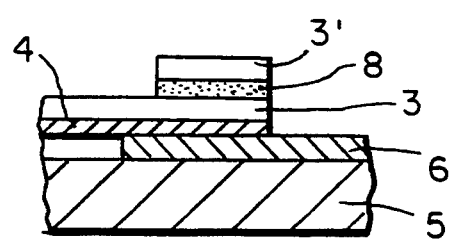
Figure 6A:
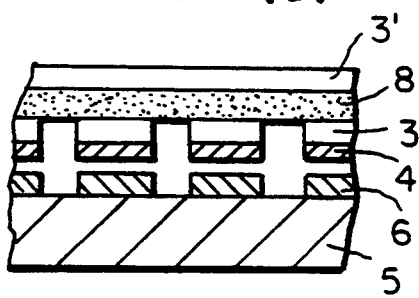
Figure 6B:
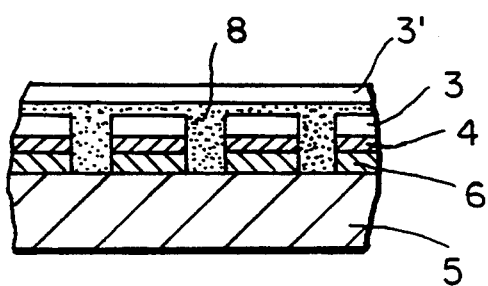

FIGS. 5(a) and (b) and FIGS. 6(a) and (b) are enlarged sectional views illustrating the method of connecting the film carrier with the land part on the outer substrate in producing the structure of FIG. 4. FIG. 5(a) and FIG. 6(a) each is a sectional view illustrating the state of the semiconductor device before the connection is established, in which an adhesive layer 8 formed on an insulating film 3' as a support is laminated to the insulating film 3 on the side opposite to the connecting lead 4 side. FIG. 5(b) and FIG. 6(b) each is a sectional view illustrating the state of the semiconductor device after the connection is established, in which a part of the adhesive is injected, by pressing, through the cut-out opening or aperture in contact with the adhesive layer 8 into the junction space between the film carrier and the outer substrate and covers the connecting parts and the surrounding areas. The views of FIG. 5 are sectional views taken along a plane parallel to the direction of the connecting lead, while those of FIG. 6 are sectional views taken along a plane perpendicular to the direction of the connecting lead.

In FIGS. 7 to 10, examples of the shape of the cut-out opening or aperture that the insulating film 3 used in the method of the present invention may have are shown. In these figures, views (a) each is a sectional view, while views (b) each is a plan view.

The insulating films 3 and 3' used in the above-described method according to the present invention are not particularly limited in its material as long as the films have electrical insulating properties. Examples of the materials of the insulating films include thermosetting or thermoplastic resins such as polyester resins, epoxy resins, urethane resins, polystyrene resins, polyethylene resins, polyamide resins, polyimide resins, ABS resins, polycarbonate resins, silicone resins, and the like. Of these, a polyimide resin is preferably employed from the standpoints of heat resistance and mechanical strength.

The connecting lead 4 formed on one side of the insulating film 3 is made of an electroconductive material. Examples of the electroconductive material include various metals such as gold, silver, copper, nickel, cobalt, lead, tin, indium, and the like, and various alloys containing such metals as main components. The connecting lead is electrically connected to a metallic wiring on an outer substrate to form a circuit according to a predetermined linear pattern so as to enable the semiconductor element contained in the semiconductor device to perform its functions.

The through-hole, cut-out opening, or aperture, as the opening 7 for adhesive forcing or adhesive injection, which is formed in the insulating film 3 of the film carrier, is important for the connection between the connecting lead 4 and the metallic wiring (land part) 6 on the outer substrate 5 and for forcing an adhesive into the space between the film carrier and the outer substrate 5. In one embodiment of the present invention, the opening 7 is at least one through-hole formed in the insulating film 3 within its bonding area to be in contact with the land part 6 on the outer substrate and also formed in an insulating film area near the bonding area, at a hole pitch smaller than the width of the connecting lead in the direction of the film thickness. The through-hole can be formed by mechanical processing or by other means such as laser processing, light processing, chemical etching, or the like in an arbitrary hole diameter and at an arbitrary hole pitch. A preferred example of the processing method for forming the through-hole is irradiation by an excimer laser. It is preferred that the diameter of each through-hole is as large as possible so long as any adjacent through-holes are not connected with each other and that the hole pitch is as small as possible so as to increase the number of through-holes to be in contact with the connecting lead. This is because in a later processing step, such through-holes facilitate forcing of an adhesive through the through-holes into the junction space between the film carrier and an outer substrate.

Figure 7A:
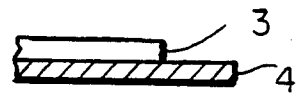
FIGS. 7 to 10 are sectional views and plan views illustrating exemplary shapes of the cut-out opening or aperture that the insulating film 3 used in the method of the present invention may have.
Figure 8A:
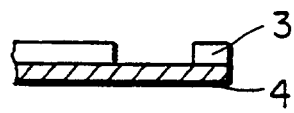
Figure 7B:
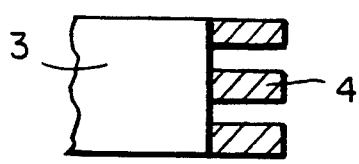
Figure 8B:
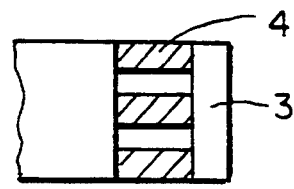
Figure 9A:
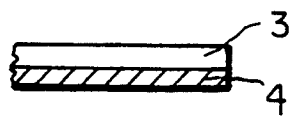
Figure 10A:
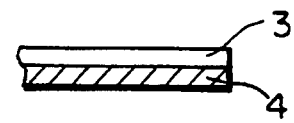
Figure 9B:
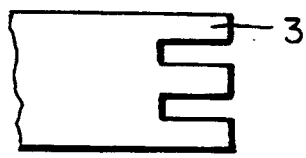
Figure 10B:
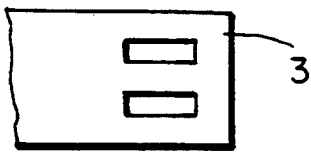

In the case where the opening for adhesive forcing or adhesive injection is a cut-out opening or aperture, it can have any of various shapes including those shown in FIGS. 7 to 10 (FIGS. 7 and 9 illustrate the shapes of exemplary cut-out openings, while FIGS. 8 and 10 illustrate the shapes of exemplary apertures). From the standpoint of the covering, protection, and reinforcement of the connecting lead 4, it is preferable for the connecting lead 4 to be processed so as to have a shape having no free end as shown in FIGS. 8 to 10. Like the above-described through-hole, the cut-out opening or aperture can be formed by mechanical processing or other means such as laser processing, light processing, chemical etching, or the like. A preferred example of the processing method for forming the cut-out opening or aperture is irradiation by an excimer laser. It is preferred that the size of the cut-out opening or aperture is as large as possible from the standpoint of easy injection of an adhesive.

When the connecting lead 4 is electrically connected to a land part 6 on an outer substrate 5 according to the above-described mounting method of the present invention, part of the adhesive constituting the adhesive layer 8 formed on the upper side of the film carrier is forced or injected through the through-hole or the cut-out opening or aperture into the space around the connecting parts and covers the connecting parts, thereby to ensure electrical conduction and, at the same time, protect and fix the connecting parts.

The adhesive used in the present invention can be either a thermosetting resin or a thermoplastic resin. Examples of such resins include epoxy resins, phenoxy resins, urethane resins, polystyrene resins, polyethylene resins, polyester resins, polyamide resins, polyimide resins, polycarbonate resins, silicone resins, acrylic resins, polyether resins, phenolic resins, and the like. Preferably, resins having a glass transition temperature ($T_g$) of 150° C. or lower are employed. These adhesive resins may be blended with an SBR-type synthetic rubber or a fluororubber before use.

Of the above-described adhesive resins, resins having a $T_g$ of 100° C. or lower are preferred from the standpoints of easy flowability in mounting and good product reliability after mounting. Examples of such preferred resins include epoxy resins, phenoxy resins, polyester resins, and the like. In the case of a resin having a $T_G$ higher than 150° C., such as poly(methacrylic acid), all-aromatic polyimides, and completely cured epoxy resins, it is difficult to force or inject the resin through the opening therefor and, even if the resin can be forcibly injected, the injected resin shows insufficient wettability on the outer substrate, resulting in poor bonding.

The present invention will be explained below in more detail by reference to the following examples, but the invention is not construed as being limited thereto.

EXAMPLES 1 AND 2

A polyimide film having a thickness of 25 μm was coated on one side with each of two kinds of adhesive resins having different glass transition temperatures as shown in Table 1 at a thickness of 10 μm. The resulting adhesive-coated films were bonded with various outer substrates according to the methods shown in FIGS. 3 and 6.

COMPARATIVE EXAMPLE

An adhesive-coated film was prepared and bonded with an outer substrate in the same manner as in Example 1 except that poly(methacrylic acid) having a $T_g$ of 185° C. was used as an adhesive resin.

TABLE 1

|  | Example 1 | Example 2 | Comparative Example |
|---|---|---|---|
| Resin | Phenoxy resin | Polyester resin | Poly(methacrylic acid) |
| $T_g$ | 100° C. | 30° C. | 185° C. |
| Outer substrate | Flexible printed-circuit substrate | ITO[*]-deposited glass substrate | Flexible printed-circuit substrate |
| Bonding method | FIG. 6 | FIG. 3 | FIG. 6 |
| Bonding conditions |  |  |  |
| Temperature | 180° C. | 150° C. | 180° C. |
| Pressure | 30 kg/cm$^2$ | 50 kg/cm$^2$ | 30 kg/cm$^2$ |
| Time | 20 sec | 20 sec | 20 sec |
| State after bonding | Good | Good | Not bonded |

[*]ITO: Indium-tin oxide

Using a hot press, bonding each of the adhesive-coated films obtained in Examples 1 and 2 and Comparative Example with each of the outer substrates 5 was then conducted by means of hot pressing. As a result, in Examples 1 and 2, the connecting lead 4, land part 6, and connecting parts were able to be completely insulated from the atmosphere and, at the same time, stable electrical conduction and high reliability could be obtained. In contrast, in Comparative Example, forcing of the resin through the minute through-hole 7 into the space between the film carrier and the outer substrate 5 was insufficient and, as a result, peeling occurred after hot pressing at the interface between the outer substrate 5 and the film carrier in the semiconductor device.

The forcing or injection of an adhesive in the mounting method of the present invention can be conducted in any way as long as the adhesive can be injected through the through-hole, cut-out opening, or aperture into the space between the film carrier and the outer substrate. However, it is preferred to use the hot pressing method in which the adhesive is heated to enhance its flowability and then forced through the opening. Hot pressing conditions are as follows: the pressure is from 5 to 500 kg/cm$^2$, preferably from 20 to 300 kg/cm$^2$ (if the outer substrate 5 is made of a brittle material, e.g., glass, the pressure is from about 5 to 100 kg/cm$^2$); the temperature is from 50° to 200° C., preferably from 100° to 180° C.; and the time is from 10 to 300 seconds, preferably from 10 to 120 seconds. Further, from a working efficiency standpoint and also the standpoint of precisely regulating the amount of the adhesive forced or injected into the space between the film carrier and an outer substrate, it is preferred to use a sheet-form adhesive prepared by coating an adhesive on one side of an insulating film 3' to form an adhesive layer.

The semiconductor device thus mounted on an outer substrate by forcing or injecting an adhesive from an adhesive layer into the space between the film carrier and the outer substrate can show stable electrical conduction and have high connection reliability because the atmosphere can be completely excluded from the connecting lead, land part, and connecting parts.

As described above, according to the semiconductor device-mounting method of the present invention, in which bonding of the film carrier in the semiconductor device with an outer substrate is conducted by forming an opening such as a through-hole, cut-out opening, or aperture for adhesive forcing or adhesive injection in the insulating film of the film carrier and by forcing or injecting an adhesive through the opening into the space where the connecting lead and the land part on the outer substrate are connected, the connecting parts are insulated from the atmosphere to provide stable electrical conduction and, at the same time, the thus-mounted semiconductor device is extremely stable to mechanical or thermal shocks. Therefore, the mounted semiconductor device obtained by the method of the present invention exhibits high connection reliability.

In particular, even in the case of multiple pin type semiconductor devices, mounted products free of inter-pin leak and having extremely high connection reliability can be obtained by the present invention since, according to the method of the present invention, an adhesive is forced or injected into the space surrounding the connecting parts and the adhesive not only covers and protects the connecting parts but establishes tenacious bonding.

Further, since the method of the invention does not use a relatively expensive, anisotropically conductive film or coating, the cost of mounted semiconductor device production can be reduced. Furthermore, in the case where adhesive forcing or injection is conducted through at least one through-hole according to the method of the present invention, the size of the connecting area between the film carrier and the outer substrate can also be reduced because the connecting area can be freely determined by selecting a suitable through-hole size and hole pitch.

While the invention has been described in detail and with reference to specific embodiments thereof, it will be apparent to one skilled in the art that various changes and modifications can be made therein without departing from the spirit and scope thereof.

What is claimed is:

1. A method of mounting a semiconductor device on an outer substrate comprising the steps of:
   providing said semiconductor device comprising a film carrier, said film carrier comprising an insulating film having a bonding area and a connecting lead on one surface thereof to be in contact with a land on said outer substrate, and a semiconductor element junctioned with said film carrier; and
   mounting said semiconductor device on said substrate by:
   forming at least one opening in said insulating film within said bonding area and in an area near said bonding area; and
   electrically connecting said connecting lead to said land on said outer substrate by forcing an adhesive through said opening formed in said bonding area and in said area near said bonding area of said insulating film to bond said insulating film to said outer substrate, wherein said adhesive has a glass transition temperature of 150° C. or lower.

2. A method as claimed in claim 1, wherein said opening is an aperture formed in said insulating film proximal said connecting lead.

3. A method as claimed in claim 1, wherein said insulating film has a layer of adhesive on a surface opposite said connecting lead.

4. A method as claimed in claim 1, wherein said insulating film is a polyimide film.

5. A method as claimed in claim 3, wherein said adhesive is forced into said opening in said insulating film by heat-pressing.

6. A method as claimed in claim 1, wherein said adhesive is forced into said opening in said insulating film by injection.

7. A method as claimed in claim 1, wherein said opening is formed by irradiation by a laser.

* * * * *